(12) United States Patent
Fukami et al.

(10) Patent No.: US 10,227,020 B2
(45) Date of Patent: Mar. 12, 2019

(54) FUEL CELL SYSTEM

(71) Applicant: TOYOTA JIDOSHA KABUSHIKI KAISHA, Toyota-shi, Aichi-ken (JP)

(72) Inventors: Tatsuya Fukami, Toyota (JP); Shinji Aso, Toyota (JP); Takao Watanabe, Nagakute (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 147 days.

(21) Appl. No.: 15/602,547

(22) Filed: May 23, 2017

(65) Prior Publication Data

US 2017/0355278 A1   Dec. 14, 2017

(30) Foreign Application Priority Data

Jun. 8, 2016   (JP) ................. 2016-114542

(51) Int. Cl.
| | | |
|---|---|---|
| B60L 11/18 | (2006.01) | |
| B60L 7/10 | (2006.01) | |
| G01P 3/00 | (2006.01) | |
| G01R 31/36 | (2019.01) | |
| H01M 10/0525 | (2010.01) | |
| H01M 10/44 | (2006.01) | |
| H01M 10/48 | (2006.01) | |
| H01M 16/00 | (2006.01) | |
| H02J 7/00 | (2006.01) | |

(Continued)

(52) U.S. Cl.
CPC ......... B60L 11/1872 (2013.01); B60L 3/0046 (2013.01); B60L 7/10 (2013.01); B60L 7/14 (2013.01); B60L 11/1887 (2013.01); G01P 3/00 (2013.01); G01R 31/3613 (2013.01); G01R 31/44 (2013.01); H01M 10/0525 (2013.01); H01M 10/443 (2013.01); H01M 10/486 (2013.01); H01M 16/006 (2013.01); H02J 7/0068 (2013.01); H02J 7/1438 (2013.01); *B60L 2210/14* (2013.01); *B60L 2240/12* (2013.01); *B60L 2240/545* (2013.01); *H01M 10/052* (2013.01); *H01M 2220/20* (2013.01); *H01M 2250/20* (2013.01); *H01M 2250/402* (2013.01); *Y02E 60/122* (2013.01); *Y02T 10/705* (2013.01); *Y02T 90/32* (2013.01); *Y02T 90/34* (2013.01)

(58) Field of Classification Search
CPC ............... B60L 11/1872; H02J 7/1438; G01R 31/3613; G01R 31/361
USPC ........................................... 701/22; 320/101
See application file for complete search history.

(56) References Cited

U.S. PATENT DOCUMENTS

| | | | |
|---|---|---|---|
| 2006/0088738 A1 | 4/2006 | Aso | |
| 2006/0113129 A1* | 6/2006 | Tabata | ............... B60K 6/365 |
| | | | 180/65.25 |

FOREIGN PATENT DOCUMENTS

| | | | |
|---|---|---|---|
| JP | 2002-204538 A | 7/2002 | |
| JP | 2004-342461 A | 12/2004 | |

(Continued)

*Primary Examiner* — Isaac G Smith
(74) *Attorney, Agent, or Firm* — Dickinson Wright, PLLC (57) ABSTRACT

A fuel cell system includes a drive motor, a fuel cell, an auxiliary machine, a secondary battery, a temperature sensor, a current sensor, and a control section. The control section controls the secondary battery for discharging by driving the drive motor or the auxiliary machine and for charging through power generation by the fuel cell or regeneration by the drive motor when a temperature measured by the temperature sensor is lower than a specified value.

7 Claims, 5 Drawing Sheets

(51) Int. Cl.
*B60L 3/00* (2019.01)
*B60L 7/14* (2006.01)
*G01R 31/44* (2006.01)
*H02J 7/14* (2006.01)
*H01M 10/052* (2010.01)

(56) References Cited

FOREIGN PATENT DOCUMENTS

| | | | |
|---|---|---|---|
| JP | 2012-119310 A | | 6/2012 |
| JP | 2012135085 A | | 7/2012 |
| JP | 2012222895 A | * | 11/2012 |
| JP | 2012222895 A | | 11/2012 |
| JP | 2013052866 A | * | 3/2013 |
| JP | 2013099029 A | | 5/2013 |

* cited by examiner

FUEL CELL SYSTEM

INCORPORATION BY REFERENCE

The disclosure of Japanese Patent Application No. 2016-114542 filed on Jun. 8, 2016 including the specification, drawings and abstract is incorporated herein by reference in its entirety.

BACKGROUND

1. Technical Field

The disclosure relates to a fuel cell system.

2. Description of Related Art

In recent years, attention has been paid to a fuel cell vehicle on which a fuel cell system using a fuel cell and a secondary cell (battery) as power supplies is mounted. Power supplied from the fuel cell system is supplied to electrical loads including a traveling motor and auxiliary machines (for example, a radiator fan, a coolant pump, a lamp, and the like).

When a temperature of the secondary battery is decreased, charging and discharging characteristics of the secondary battery are degraded. For example, when a low-temperature lithium-ion cell is charged, lithium (Li) is precipitated on a negative electrode. As a result, performance degradation such as decreased cell capacity occurs. Thus, when a temperature of the cell is low, it is required to promptly increase the temperature of the cell.

In Japanese Patent Application Publication No. 2012-135085 (JP 2012-135085 A), a booster system for a secondary battery is disclosed, and the booster system includes: a voltage converter; a secondary battery connected to an input side of the voltage converter; and a capacitor connected to an output side of the voltage converter. In the system, the charging and the discharging between the secondary battery and the capacitor are repeatedly performed, and heat generated in conjunction with the charging and the discharging is used to increase the temperature of the secondary battery.

SUMMARY

Because an amount of the power that can be stored in the capacitor is small, a heating value that is acquired by the charging and the discharging of the power between the secondary battery and the capacitor is small. Thus, the temperature of the secondary battery may not be increased at a favorable speed by a method of increasing the temperature of the secondary battery as described above.

The disclosure provides a technique of promptly increasing a temperature of a secondary battery in a fuel cell system.

A first aspect of the disclosure includes a drive motor, a fuel cell, an auxiliary machine, a secondary battery, a temperature sensor, a current sensor, and a control section. The drive motor generates a driving force of a mobile object and regenerates kinetic energy of the mobile object to electrical energy. The fuel cell supplies drive power to the drive motor. The auxiliary machine is used for power generation by the fuel cell. The secondary battery supplies the drive power to the drive motor and the auxiliary machine. The temperature sensor measures a temperature of the secondary battery. The current sensor measures a discharged current of the secondary battery. The control section that is configured to perform a discharging of the secondary battery through driving the drive motor or driving the auxiliary machine and to perform a charging of the secondary battery through the power generation by the fuel cell or regeneration by the drive motor when the temperature measured by the temperature sensor is lower than a specified value. In addition, the control section stops the discharging and performs the charging in cases where an integrated value of the discharged current, which is measured by the current sensor, is smaller than a specified upper limit value and then the integrated value reaches the specified upper limit value when the discharging is performed. Furthermore, the control section stops the charging and performs the discharging in cases where the integrated value of the discharged current, which is measured by the current sensor, exceeds a specified lower limit value and then the integrated value reaches the specified lower limit value when the charging is performed.

According to the first aspect of the disclosure, in a fuel cell system, the control section controls the secondary battery for the discharging by driving the drive motor or the auxiliary machine and the charging through the power generation by the fuel cell or the regeneration by the drive motor. As a result, a larger heating value than the heating value that is acquired by the charging and the discharging of the power between the secondary battery and the capacitor can be acquired. Thus, the temperature of the secondary battery can promptly be increased in the fuel cell system.

The first aspect of the disclosure includes a speed sensor that acquires a measured value of a speed of the mobile object. The control section may control the discharging and the charging such that amounts of the discharging and the charging per unit time are decreased as the speed measured by the speed sensor is increased.

In the first aspect of the disclosure, a fluctuation in demanded power for the secondary battery may be set such that the fluctuation in the demanded power for the secondary battery is decreased as the speed measured by the speed sensor is increased.

In the first aspect of the disclosure, the control section may determine an amounts of the discharging and the charging per unit time in accordance with the temperature of the secondary battery, which is measured by the temperature sensor, and control the discharging and the charging.

In the first aspect of the disclosure, the control section may control the discharging and the charging such that the amounts of the discharging and the charging per unit time are decreased as the temperature of the secondary battery is increased.

In the first aspect of the disclosure, the control section may control the discharging and the charging such that the amounts of the discharging and the charging per unit time are decreased as the temperature of the secondary battery is decreased.

A second aspect of the disclosure includes: a drive motor that generates a driving force of a mobile object and regenerates kinetic energy of the mobile object to electrical energy; a fuel cell that supplies drive power to the drive motor; an auxiliary machine that is used for power generation by the fuel cell; a secondary battery that supplies the drive power to the drive motor and the auxiliary machine; a temperature sensor that measures a temperature of the secondary battery; a current sensor that measures a charged current of the secondary battery; and a control section that is configured to perform a discharging of the secondary battery through driving the drive motor or driving the auxiliary machine and to perform a charging of the secondary battery through power generation by the fuel cell or regeneration by the drive motor when the temperature measured by the temperature sensor is lower than a specified value. The control section stops the charging and performs the discharging in cases where an integrated value of the charged current, which is measured by the current sensor, is smaller than a specified upper limit value and then the integrated value reaches the specified upper limit value when the charging is performed, and stops the discharging and performs the charging in cases where the integrated value of the charged current, which is measured by the current sensor, exceeds a specified lower limit value and then the integrated value reaches the specified lower limit value when the discharging is performed.

BRIEF DESCRIPTION OF THE DRAWINGS

Features, advantages, and technical and industrial significance of exemplary embodiments will be described below with reference to the accompanying drawings, in which like numerals denote like elements, and wherein.

DETAILED DESCRIPTION OF EMBODIMENTS

A detailed description will hereinafter be made on embodiments with reference to the drawings. Note that the scope of the disclosure is not limited thereto.

[Configuration of Fuel Cell System]

Figure 1:
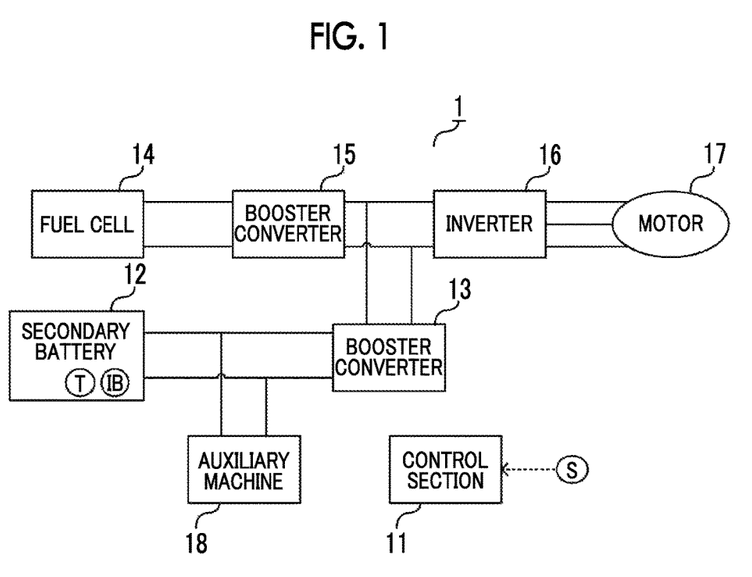
FIG. 1 is a view of a schematic configuration of a fuel cell system according to an embodiment.

Referring to FIG. 1, a description will be made on an example of a schematic configuration of a fuel cell system in the embodiment. A fuel cell system 1 includes, as main components, a control section 11, a secondary battery 12, a booster converter 13, a fuel cell 14, a booster converter 15, an inverter 16, a motor 17, an auxiliary machine 18, and a speed sensor S.

The fuel cell system 1 is a system that can be mounted on a vehicle (mobile object) such as a fuel cell vehicle (FCV). Note that FIG. 1 merely shows the main components of the fuel cell system 1, and thus the fuel cell system 1 can include other components that are provided in a well-known fuel cell system mounted on the mobile object.

The secondary battery 12 is a power storage section that can be charged and discharged. The secondary battery 12 is constructed of a lithium-ion battery or the like, for example. The secondary battery 12 is inserted in a discharge path of the fuel cell 14 and is connected in parallel to the fuel cell 14 with respect to the inverter 16. Of demanded power by electrical loads including the motor 17 and the auxiliary machine 18, the secondary battery 12 outputs power from which target output of the fuel cell 14, which is set in advance, is subtracted as drive power of the electrical loads. That is, the secondary battery 12 supplies the drive power to the motor 17 and the auxiliary machine 18. In addition, the secondary battery 12 stores the power acquired from the motor 17 through regeneration.

The secondary battery 12 includes a temperature sensor T and a current sensor IB. The temperature sensor T is a sensor that measures a temperature of the secondary battery 12 and outputs a measurement result. The current sensor IB is a sensor that measures a discharged current by the secondary battery 12.

The booster converter 13 is a direct-current (DC) voltage converter that is provided between the secondary battery 12 and the inverter 16. The booster converter 13 is configured by using an intelligent power module (IPM), for example. The booster converter 13 boosts a DC voltage of the power supplied from the secondary battery 12 and outputs the power to the inverter 16 side.

The fuel cell 14 is configured by including a solid polymer electrolyte cell stack in which plural cells (a single cell (power generation body) that includes an anode, a cathode, and an electrolyte) are stacked in series. In an operation during normal power generation by the fuel cell 14, an oxidation reaction represented by an equation (1) occurs at the anode, and a reduction reaction represented by an equation (2) occurs at the cathode. As the entire fuel cell 14, an electrogenic reaction represented by an equation (3) occurs, and the power is thereby generated.

(1)

(2)

(3)

The booster converter 15 is a DC voltage converter that is provided between the fuel cell 14 and the inverter 16. The booster converter 15 boosts the DC voltage of the power supplied from the fuel cell 14 and outputs the power to the inverter 16. The booster converter 15 is constructed of the IPM and the like, for example.

The inverter 16 is an inverter that is provided between the motor 17 and each of the booster converter 13 and the booster converter 15. The inverter 16 converts the DC power supplied from the fuel cell 14 or the secondary battery 12 to three-phase AC power and supplies the three-phase AC power to the motor 17. The inverter 16 is constructed of the IPM, for example.

The motor 17 is a drive motor that generates a driving force used to drive wheels and the like of the mobile object, on which the fuel cell system 1 is mounted. The motor 17 uses the power supplies from the fuel cell 14 or the secondary battery 12 via the inverter 16 as drive power. In addition, the motor 17 regenerates kinetic energy of the mobile object, on which the fuel cell system 1 is mounted, to electrical energy (in accordance with rotation of the motor 17, for example). Power generated by the regeneration is stored in the secondary battery 12.

The auxiliary machine 18 is a group of auxiliary machines that include an auxiliary machine used for the power generation by the fuel cell 14. The auxiliary machine 18 includes, for example, a hydrogen pump and a coolant pump for the fuel cell 14 and the like. The auxiliary machine 18 uses the power supplied from the secondary battery 12 as drive power.

The speed sensor S is a sensor that acquires a measured value of a travel speed of the mobile object, on which the fuel cell system 1 is mounted. The travel speed is computed on the basis of a rotational speed of the motor 17 and the like, for example.

The control section 11 is constructed of a computer that includes a central processing unit (CPU), read only memory (ROM), and random access memory (RAM). Based on signals received from other components, programs stored in a storage section such as the RAM, and the like, the control section 11 controls processing and an operation of each of the components provided in the fuel cell system 1 and performs various calculations required for the control.

For example, when the temperature of the secondary battery 12 is lower than a specified value, the control section 11 controls the charging and the discharging of the secondary battery 12, so as to increase the temperature of the secondary battery 12. More specifically, when the temperature acquired from the temperature sensor T is lower than the specified value (a temperature threshold), the control section 11 controls the secondary battery 12 for the discharging by driving at least the motor 17 or the auxiliary machine 18 and for the charging through at least the power generation by the fuel cell 14 or the regeneration by the motor 17. Note that, as the above temperature threshold, a higher temperature than a temperature at which charging and discharging characteristics of the secondary battery 12 start being degraded due to a temperature decrease (for example, a temperature that is three degrees higher than the temperature at which the charging and discharging characteristics start being degraded) is set. In addition, the control section 11 can control the charging and the discharging of the secondary battery 12 in accordance with the speed acquired from the speed sensor S.

By increasing the temperature of the secondary battery 12 in such a method, the temperature of the secondary battery 12 can promptly be increased in the fuel cell system 1. In JP 2012-135085 A, the charging and the discharging of the power are repeated between the secondary battery and the capacitor, and the temperature of the secondary battery is increased by using heat that is generated in conjunction with the charging and the discharging. Because the amount of the power that can be stored in the capacitor is small, the heating value acquired by the charging and the discharging of the power between the secondary battery and the capacitor is small. Meanwhile, in this embodiment, the control section 11 controls the secondary battery 12 for the discharging by driving the motor 17 or the auxiliary machine 18 and for the charging through the power generation by the fuel cell 14 or the regeneration by the motor 17. As a result, a larger heating value than the heating value that is acquired by the charging and the discharging of the power between the secondary battery and the capacitor can be acquired. Thus, the temperature of the secondary battery 12 can promptly be increased in the fuel cell system 1.

Figure 2:
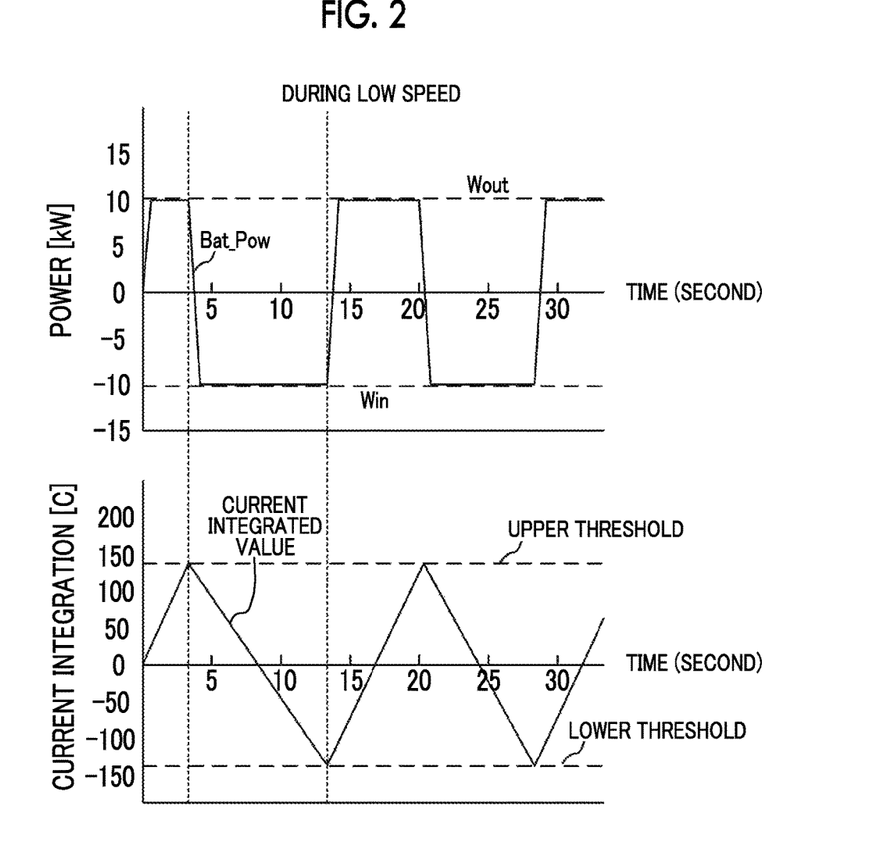
FIG. 2 includes graphs that show changes in demanded power for a secondary battery and charging and discharging of the secondary battery in the fuel cell system according to the embodiment.
Figure 3:
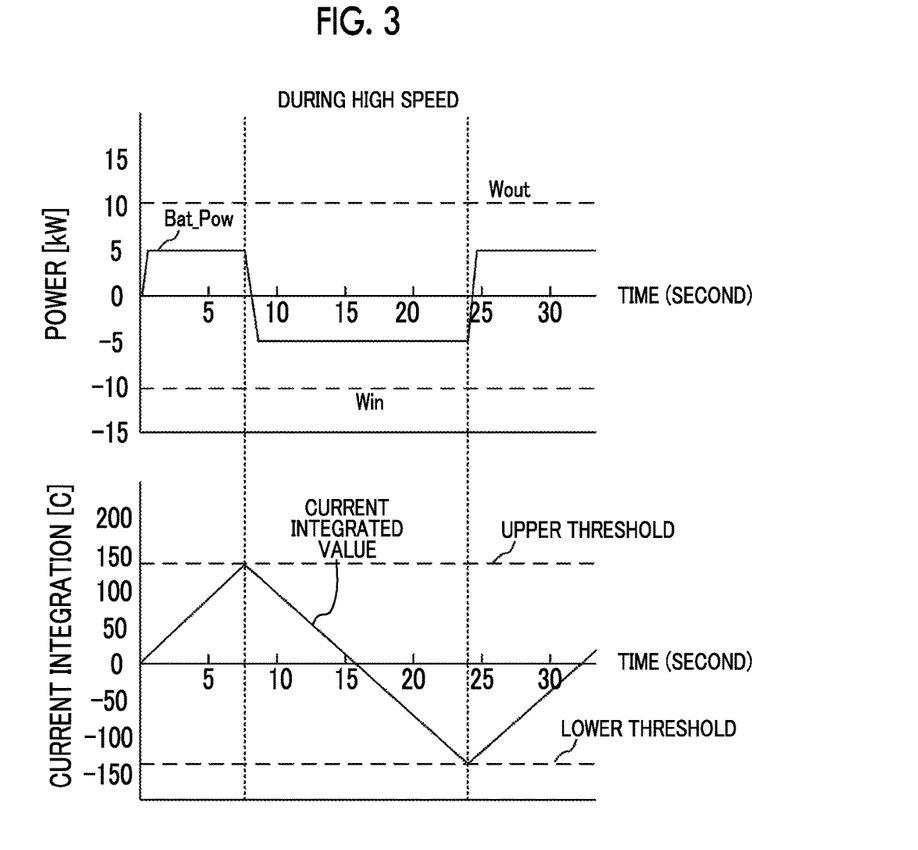
FIG. 3 includes graphs that show changes in the demanded power for the secondary battery and the charging and the discharging of the secondary battery in the fuel cell system according to the embodiment.

Referring to FIG. 2 and FIG. 3, a further detailed description will be made on examples of the control of the charging and the discharging of the secondary battery 12 by the control section 11.

First, referring to FIG. 2, a description will be made on an example of the control of the charging and the discharging of the secondary battery 12 at a time when the speed acquired from the speed sensor S is low (for example, 30 km/h). An upper graph in the drawing shows a time-series change in demanded power for the secondary battery 12 by a solid line Bat_Pow. A horizontal axis represents a lapse of time with time at which the charging and the discharging of the secondary battery 12 are started for a temperature increase of the secondary battery 12 (that is, time at which the temperature acquired from the temperature sensor T becomes lower than the temperature threshold) being 0. A vertical axis represents the demanded power. In this example, an increase and a decrease in the demanded power are controlled to be located between a power threshold Wout (10 kW) at overcharging of the secondary battery 12 and a power threshold Win (−10 kW) at over-discharging of the secondary battery 12.

A lower graph in FIG. 2 shows a time-series change in an integrated value of the discharged current by the secondary battery 12 that is measured by the current sensor IB, and the time-series change corresponds to the lapse of the time in the upper graph. A horizontal axis represents the lapse of the time. A vertical axis represents the integrated value of the discharged current by the secondary battery 12 that is measured by the current sensor IB. The change in the integrated value of the discharged current, which is shown in this graph, is controlled by the control section 11.

In this embodiment, a value of the demanded power for the secondary battery 12 and an amount of the discharged current by the secondary battery 12 per unit time (that is, a slope of the change in a current integrated value in the lower graph in FIG. 2) correspond to each other on the basis of a result of an experiment that is performed in advance, or the like.

When the demanded power for the secondary battery 12 is the power threshold Wout (that is, 10 kW), the control section 11 discharges the secondary battery 12 by a discharging amount per unit time that corresponds to the demanded power. As described above, the discharging is performed by driving at least the motor 17 or the auxiliary machine 18.

Thereafter, when the integrated value of the discharged current by the secondary battery 12 reaches an upper threshold (140 C), the control section 11 controls the secondary battery 12 to switch from the discharging to the charging thereof. When the demanded power for the secondary battery 12 is the power threshold Win (that is, −10 kW), the control section 11 charges the secondary battery 12 by a charging amount per unit time that corresponds to the demanded power. As described above, the charging is performed through at least the power generation by the fuel cell 14 or the regeneration by the motor 17. Thereafter, when the integrated value of the discharged current by the secondary battery 12 reaches a lower threshold (−140 C), the control section 11 controls the secondary battery 12 to switch from the charging to the discharging thereof.

Next, referring to FIG. 3, a description will be made on an example of the control of the charging and the discharging of the secondary battery 12 at a time when the speed acquired from the speed sensor S is high (for example, 100 km/h). An upper graph in the drawing shows the time-series change in the demanded power for the secondary battery 12 by the solid line Bat_Pow. Similar to FIG. 2, a horizontal axis of the upper graph in FIG. 3 represents the lapse of the time with the time at which the charging and the discharging of the secondary battery 12 are started for the temperature increase of the secondary battery 12 being 0. A vertical axis represents the demanded power. In this example, the increase and the decrease in the demanded power are controlled to be located between 5 kW that is a lower value than the power threshold Wout at the overcharging of the secondary battery 12 and −5 kW that is a higher value than the power threshold Win at the over-discharging of the secondary battery 12.

In other words, in the control of the charging and the discharging of the secondary battery 12 for the temperature increase of the secondary battery 12, when the speed of the mobile object is high, a fluctuation in the demanded power for the secondary battery 12 is set to be small. In general, the demanded power for the secondary battery 12 is determined on the basis of a value that is acquired by multiplying the rotational speed of the motor 17 by torque. Accordingly, even in the case where the fluctuation in the torque is the same, the demanded power for the secondary battery 12 is more likely to be changed when the mobile object travels at a high speed. In consideration of such a point, as described above, in this embodiment, the fluctuation in the demanded power for the secondary battery 12 for the temperature increase of the secondary battery 12 is controlled to fall within narrower fluctuation width than width between the power threshold Wout at the overcharging of the secondary battery 12 and the power threshold Win at the over-discharging of the secondary battery 12 during a high-speed travel. As a result, even when the demanded power fluctuates due to another cause, such a risk that the demanded power exceeds the power threshold Wout at the overcharging or falls below the power threshold Win at the over-discharging can be suppressed.

A lower graph in FIG. 3 shows the time-series change in the integrated value of the discharged current by the secondary battery 12 that is measured by the current sensor IB, and the time-series change corresponds to the lapse of the time in the upper graph. Similar to the example in FIG. 2, the change in the integrated value of the discharged current shown in this graph is controlled by the control section 11.

When the demanded power for the secondary battery 12 is 5 kW, the control section 11 discharges the secondary battery 12 by the discharging amount per unit time that corresponds to the demanded power. When compared to the low-speed example in FIG. 2, the amount of the demanded power is small. Thus, the lower graph in FIG. 3 shows that the discharging is performed by a smaller discharging amount than the discharging amount per unit time in the example of FIG. 2 (that is, the slope of the change in the current integrated value is gentler).

Thereafter, when the integrated value of the discharged current by the secondary battery 12 reaches the upper threshold (140 C), the control section 11 controls the secondary battery 12 to switch from the discharging to the charging thereof. When the demanded power for the secondary battery 12 is −5 kW, the control section 11 charges the secondary battery 12 by the charging amount per unit time that corresponds to the demanded power. When compared to the amount of the demanded power (that is, 10 kW) for charging in the low-speed example in FIG. 2, the amount of the demanded power (that is, 5 kW) for charging is small in the lower graph in FIG. 3. Thus, the lower graph in FIG. 3 shows that the charging is performed by a smaller charging amount than the charging amount per unit time in the example of FIG. 2. Thereafter, when the integrated value of the discharged current by the secondary battery 12 reaches the lower threshold (−140 C), similar to the example in FIG. 2, the control section 11 controls the secondary battery 12 to switch from the charging to the discharging thereof.

As it has been described so far, according to this embodiment, the control section 11 controls the charging and the discharging of the secondary battery 12 for the temperature increase of the secondary battery 12 such that amounts of the charging and discharging per unit time of the secondary battery 12 are decreased as the speed measured by the speed sensor S is increased. As a result, as described above, even when the demanded power fluctuates due to the other cause, such a possibility that the demanded power exceeds the power threshold Wout at the overcharging or falls below the power threshold Win at the over-discharging can be reduced.

Note that, in this embodiment, the control section 11 can control the charging and the discharging of the secondary battery 12 in accordance with the temperature of the secondary battery 12, which is acquired from the temperature sensor T. For example, the control section 11 can set the demanded power for the secondary battery 12 such that the fluctuation width thereof is decreased as the temperature of the secondary battery 12 is increased or decreased. As a result, the control section 11 controls the secondary battery 12 for the charging and the discharging such that the amounts of the charging and discharging per unit time of the secondary battery 12 are decreased (that is, the slope of the change in the current integrated value becomes gentler) as the temperature of the secondary battery 12 is increased or decreased. In other words, the control section 11 determines the amounts of the charging and the discharging per unit time of the secondary battery 12 in accordance with the temperature of the secondary battery 12, which is measured by the temperature sensor T, and controls the secondary battery 12 for the charging and the discharging on the basis of the determined amounts.

[Control Flow of Discharging and Charging of Secondary Battery]

Figure 4:
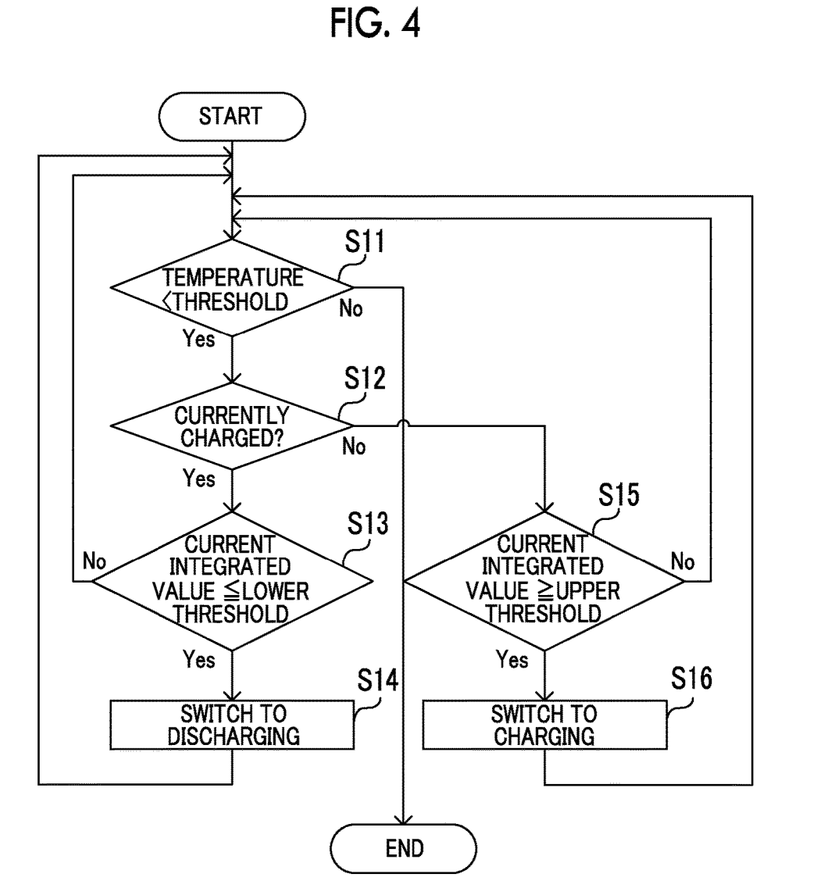
FIG. 4 is a flowchart that shows charging and discharging control of the secondary battery in the fuel cell system according to the embodiment.

Referring to FIG. 4, a description will be made on a charging and discharging control flow for the temperature increase of the secondary battery 12. This processing is performed through the control by the control section 11.

First, in step S11, the control section 11 determines whether the temperature of the secondary battery 12, which is acquired from the temperature sensor T, is lower than the specified value. As the specified value of the temperature, the higher temperature than the temperature at which the charging and discharging characteristics of the secondary battery 12 start being degraded due to the temperature decrease (for example, the temperature that is three degrees higher than the temperature at which the charging and discharging characteristics start being degraded) is set. If it is determined that the temperature of the secondary battery 12 is lower than the specified value, the processing proceeds to step S12. If not, the processing shown in FIG. 4 is terminated.

In step S12, the control section 11 determines whether the secondary battery 12 is currently charged. If the secondary battery 12 is currently charged, the processing proceeds to step S13. If not, the processing proceeds to step S15.

In step S13, the control section 11 determines whether the integrated value of the discharged current by the secondary battery 12, which is measured by the current sensor IB, is equal to or smaller than the lower threshold. If the integrated value of the discharged current by the secondary battery 12 is equal to or smaller than the lower threshold, the processing proceeds to step S14. If not, the processing proceeds to step S11.

In step S14, the control section 11 switches an operation of the secondary battery 12 from the charging to the discharging. More specifically, in the cases where the integrated value of the discharged current of the secondary battery 12, which is measured by the current sensor IB, exceeds the lower threshold (a specified lower limit value) and thereafter the integrated value of the discharged current by the secondary battery 12 reaches the lower threshold (the specified lower limit value) in a state where the secondary battery 12 is charged, the control section 11 controls the secondary battery 12 to stop the charging and to perform the discharging. The secondary battery 12 is discharged by driving at least the motor 17 or the auxiliary machine 18. Thereafter, the processing proceeds to step S11.

In step S15, the control section 11 determines whether the integrated value of the discharged current by the secondary battery 12, which is measured by the current sensor IB, is equal to or larger than the upper threshold. If the integrated value of the discharged current by the secondary battery 12 is equal to or larger than the upper threshold, the processing proceeds to step S16. If not, the processing proceeds to step S11.

In step S16, the control section 11 switches the operation of the secondary battery 12 from the discharging to the charging. More specifically, in the cases where the integrated value of the discharged current of the secondary battery 12, which is measured by the current sensor IB, is smaller than the upper threshold (a specified upper limit value) and thereafter the integrated value of the discharged current by the secondary battery 12 reaches the upper threshold (the specified upper limit value) in a state where the secondary battery 12 is discharged, the control section 11 controls the secondary battery 12 to stop the discharging and perform the charging. The secondary battery 12 is charged through at least the power generation by the fuel cell 14 or the regeneration by the motor 17. Thereafter, the processing proceeds to step S11.

As it has been described so far, according to this embodiment, the control section 11 controls the secondary battery 12 for the discharging by driving at least the motor 17 or the auxiliary machine 18 and for the charging through at least the power generation by the fuel cell 14 or the regeneration by the motor 17. As a result, the larger heating value than the heating value that is acquired by the charging and the discharging of the power between the secondary battery and the capacitor can be acquired. Thus, the temperature of the secondary battery 12 can promptly be increased in the fuel cell system 1.

Figure 5:
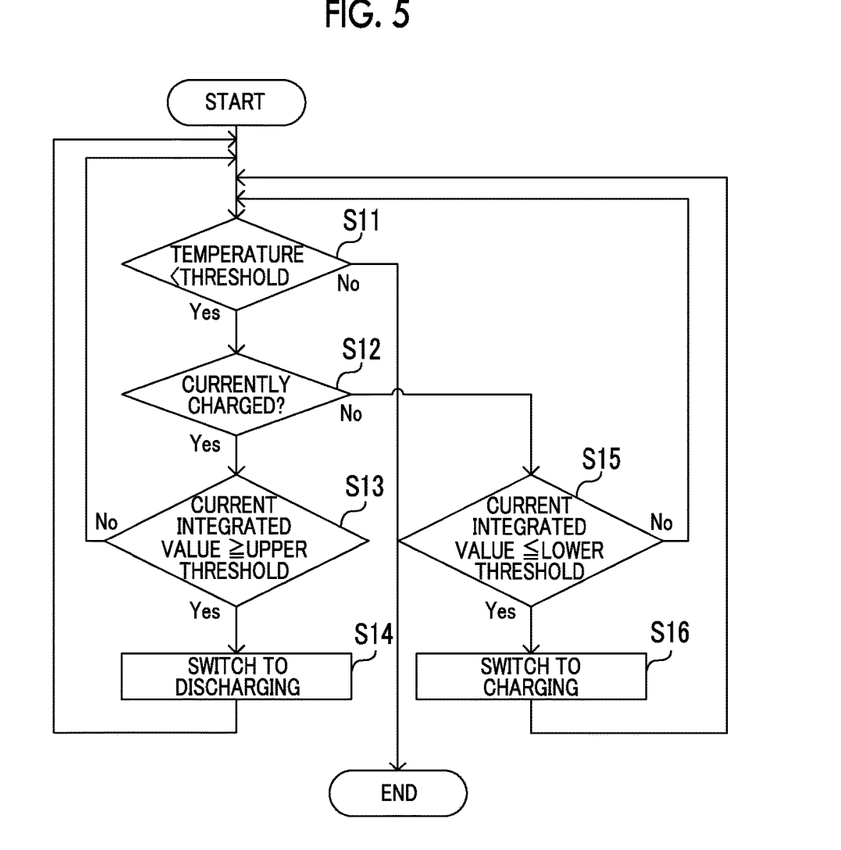
FIG. 5 is a flowchart that shows charging and discharging control of a secondary battery in a fuel cell system according to another embodiment.

In the above embodiment, the current sensor that measures the discharged current by the secondary battery is used. However, the current sensor is not limited thereto. For example, a current sensor that measures the charged current of the secondary battery can be used. In another embodiment in which the current sensor measuring the charged current of the secondary battery is used, as shown in FIG. 5, the control section is configured to stop charging the secondary battery and discharge the secondary battery in the cases where an integrated value of the charged current, which is measured by the current sensor, is smaller than a specified upper limit value and thereafter the integrated value reaches the specified upper limit value at a time when the secondary battery is charged. The control section is also configured to stop discharging the secondary battery and charge the secondary battery in the cases where the integrated value of the charged current, which is measured by the current sensor, exceeds a specified lower limit value and thereafter the integrated value reaches the specified lower limit value at a time when the secondary battery is discharged.

The description has been made so far on the embodiments with reference to the drawings. However, the scope of the disclosure is not limited to such embodiments. It is obvious for a person skilled in the art to arrive at various changed examples or modified examples within the sprit described in the claims, and those naturally belong to the technical scope of the disclosure.

What is claimed is:

1. A fuel cell system comprising:
    a drive motor that generates a driving force of a mobile object and regenerates kinetic energy of the mobile object to electrical energy;
    a fuel cell that supplies drive power to the drive motor;
    an auxiliary machine that is used for power generation by the fuel cell;
    a secondary battery that supplies the drive power to the drive motor and the auxiliary machine;
    a temperature sensor that measures a temperature of the secondary battery;
    a current sensor that measures a discharged current of the secondary battery; and
    a control section that is configured to perform a discharging of the secondary battery through driving the drive motor or driving the auxiliary machine and to perform a charging of the secondary battery through the power generation by the fuel cell or regeneration by the drive motor when the temperature measured by the temperature sensor is lower than a specified value, wherein
    the control section stops the discharging and performs the charging in cases where an integrated value of the discharged current, which is measured by the current sensor, is smaller than a specified upper limit value and then the integrated value reaches the specified upper limit value when the discharging is performed, and stops the charging and performs the discharging in cases where the integrated value of the discharged current, which is measured by the current sensor, exceeds a specified lower limit value and then the integrated value reaches the specified lower limit value when the charging is performed.

2. The fuel cell system according to claim 1 further comprising:
    a speed sensor that acquires a measured value of a speed of the mobile object, wherein
    the control section controls the discharging and the charging such that amounts of the discharging and the charging per unit time are decreased as the speed measured by the speed sensor is increased.

3. The fuel cell system according to claim 2, wherein
    a fluctuation in demanded power for the secondary battery is set such that the fluctuation in the demanded power for the secondary battery is decreased as the speed measured by the speed sensor is increased.

4. The fuel cell system according to claim 1, wherein
    the control section determines an amounts of the discharging and the charging per unit time in accordance with the temperature of the secondary battery, which is measured by the temperature sensor, and controls the discharging and the charging.

5. The fuel cell system according to claim 4, wherein
    the control section controls the discharging and the charging such that the amounts of the discharging and the charging per unit time are decreased as the temperature of the secondary battery is increased.

6. The fuel cell system according to claim 4, wherein
    the control section controls the discharging and the charging such that the amounts of the discharging and the charging per unit time are decreased as the temperature of the secondary battery is decreased.

7. A fuel cell system comprising:
    a drive motor that generates a driving force of a mobile object and regenerates kinetic energy of the mobile object to electrical energy;
    a fuel cell that supplies drive power to the drive motor;
    an auxiliary machine that is used for power generation by the fuel cell;
    a secondary battery that supplies the drive power to the drive motor and the auxiliary machine;
    a temperature sensor that measures a temperature of the secondary battery;

a current sensor that measures a charged current of the secondary battery; and a control section that is configured to perform a discharging of the secondary battery through driving the drive motor or driving the auxiliary machine and to perform a charging of the secondary battery through the power generation by the fuel cell or regeneration by the drive motor when the temperature measured by the temperature sensor is lower than a specified value, wherein the control section stops the charging and performs the discharging in cases where an integrated value of the charged current, which is measured by the current sensor, is smaller than a specified upper limit value and then the integrated value reaches the specified upper limit value when the charging is performed, and stops the discharging and performs the charging in cases where the integrated value of the charged current, which is measured by the current sensor, exceeds a specified lower limit value and then the integrated value reaches the specified lower limit value when the discharging is performed.

* * * * *